(12) United States Patent
Sharma et al.

(10) Patent No.: US 8,975,963 B2
(45) Date of Patent: Mar. 10, 2015

(54) OFFSET REDUCTION FOR ANALOG FRONT-ENDS

(71) Applicant: Texas Instruments Incorporated, Dallas, TX (US)

(72) Inventors: Ajit Sharma, Dallas, TX (US); Kemal S. Demirci, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 74 days.

(21) Appl. No.: 13/835,264

(22) Filed: Mar. 15, 2013

(65) Prior Publication Data

US 2013/0257536 A1 Oct. 3, 2013

Related U.S. Application Data

(60) Provisional application No. 61/616,571, filed on Mar. 28, 2012.

(51) Int. Cl.
*H03F 3/45* (2006.01)

(52) U.S. Cl.
CPC ........ *H03F 3/45076* (2013.01); *H03F 3/45475* (2013.01); *H03F 3/45973* (2013.01); *H03F 2203/45138* (2013.01); *H03F 2203/45522* (2013.01); *H03F 2203/45526* (2013.01); *H03F 2203/45212* (2013.01)
USPC .............................................. 330/259; 330/9

(58) Field of Classification Search
USPC ...................... 330/259, 9, 260, 261
See application file for complete search history.

(56) References Cited

U.S. PATENT DOCUMENTS

| | | | | | |
|---|---|---|---|---|---|
| 4,042,886 | A | * | 8/1977 | Hanna .......................... | 330/256 |
| 5,798,664 | A | * | 8/1998 | Nagahori et al. ............. | 327/307 |
| 6,304,144 | B1 | * | 10/2001 | Yamazaki et al. ............ | 330/259 |
| 7,132,882 | B2 | * | 11/2006 | Chen et al. ........................ | 330/9 |
| 7,750,737 | B2 | * | 7/2010 | Srinivasa et al. ............. | 330/259 |

* cited by examiner

*Primary Examiner* — Henry Choe
(74) *Attorney, Agent, or Firm* — Alan A. R. Cooper; Frederick J. Telecky, Jr.

(57) ABSTRACT

A circuit includes a first amplifier configured to amplify an input signal to generate an output signal. An offset sensor is configured to sense DC offset based on the output signal, where the offset sensor includes a second amplifier configured to generate an offset reduction signal for the first amplifier based on the sensed DC offset. A T-network in the circuit includes at least three resistors coupled to provide a feedback connection between the input signal and the output signal for the first amplifier and to receive the offset reduction signal to mitigate DC offset in the first amplifier. Since this method reduces the low-frequency component of the signal, it also shapes and reduces the flicker noise.

18 Claims, 5 Drawing Sheets

OFFSET REDUCTION FOR ANALOG FRONT-ENDS

CROSS-REFERENCE TO RELATED APPLICATION

This application claims the benefit of U.S. Provisional Patent Application 61/616,571 filed on Mar. 28, 2012, and entitled OFFSET CANCELLATION TECHNIQUE FOR ANALOG FRONT-ENDS, the entirety of which is incorporated by reference herein.

TECHNICAL FIELD

This disclosure relates to amplifier circuits, and more particularly to offset reduction for amplifiers that employ T-networks in feedback loops.

BACKGROUND

Direct Current (DC) voltage offset can create problems in analog front-ends for various amplifier applications. For instance, DC offset can be amplified by the circuit noise gain when the amplifier front-end employs a transimpedance (resistance or capacitance) amplifier as the first stage. Often times, signals that have a high DC offset component need to be capacitively coupled into the signal path before conditioning in subsequent amplifier stages. The coupling capacitors can be large and thus, may not be suitably placed on-chip for a given application. Conventional offset cancellation techniques can include auto-zeroing and/or chopping, for example. One disadvantage of these techniques is that they cancel only amplifier offset and not the DC offset arising from the input signal itself. Secondly, these techniques can require complicated clocking circuitry and such switching can introduce additional artifacts via charge injection or clock feedthrough. Finally, in order to cancel sensor offset, expensive trimming of the sensor elements may also be required.

SUMMARY

This disclosure relates to systems and methods for reducing DC offset in amplifier front-end circuits that employ T-Networks in feedback loops.

In one example, a circuit is provided. The circuit includes a first amplifier configured to amplify an input signal to generate an output signal. An offset sensor is configured to sense DC offset based on the output signal, where the offset sensor includes a second amplifier configured to generate an offset reduction signal for the first amplifier based on the sensed DC offset. The circuit includes a T-network that includes at least three resistors coupled to provide a feedback connection between the input signal and the output signal for the first amplifier and to receive the offset reduction signal to mitigate DC offset in the first amplifier.

In another example, a method includes adjusting a T-network feedback loop to set a signal gain of a first amplifier. The method includes sensing a DC offset from the first amplifier via a second amplifier. This includes adjusting a gain of the second amplifier in relation to the DC offset sensed from the output of the first amplifier. The method includes applying an output from the second amplifier to the T-network feedback loop to mitigate the DC offset in the first amplifier.

In yet another example, an integrated circuit includes a fully-differential amplifier configured to amplify a first input signal and a second input signal to generate a first differential output signal and a second differential output signal. The circuit includes a first offset sensor configured to sense DC offset based on the first output signal, the first offset sensor having a first auxiliary amplifier configured to generate a first offset reduction signal for the differential amplifier based on the sensed DC offset of the first output signal. The circuit includes a second offset sensor configured to sense DC offset based on the second output signal, the second offset sensor having a second auxiliary amplifier configured to generate a second offset reduction signal for the differential amplifier based on the sensed DC offset of the second output signal.

The circuit includes a first T-network that includes at least three resistors coupled to provide a feedback connection between the first input signal and the first output signal for the differential amplifier and to receive the first offset reduction signal to mitigate DC offset in first output signal of the differential amplifier. The circuit also includes a second T-network that includes at least three resistors coupled to provide a feedback connection between the second input signal and the second output signal for the differential amplifier and to receive the second offset reduction signal to mitigate DC offset in the second output signal of the differential amplifier.

DETAILED DESCRIPTION

Figure 1:
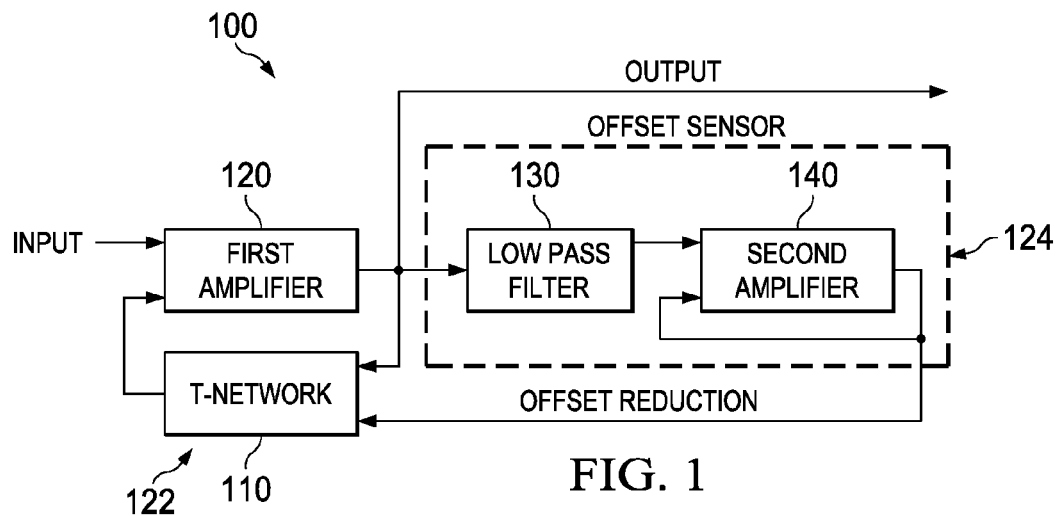
FIG. 1 illustrates a circuit to provide offset reduction in analog front-ends that employs a T-Network in a feedback loop.

FIG. 1 illustrates a circuit 100 to provide offset reduction in analog front-ends that employs a T-Network 110 in a feedback loop. As shown, the T-Network 110 can be employed as a feedback loop for a first amplifier 120 that receives an input and generates an output signal. The T-network 110 can be utilized to provide a substantially large on-chip and/or in-circuit impedance for the first amplifier 120. Although T-networks are useful to conserve integrated circuit area by providing large impedances in a small circuit area, they can further amplify the DC offset present in the circuit 100 The DC offset can also be generated by the first amplifier 120 in addition to any signal offset that may be encountered (e.g., offset that may be received from an input sensor that generates the input). To mitigate such offsets, additional feedback can be provided at one of the nodes of the T-Network to counteract the offsets.

In the circuit 100, a continuous-time feed-back loop, which is shown as an offset reduction loop 122, can be provided that automatically compensates for DC offset. This feature provides a high-pass transfer characteristic in addition to a traditionally low-pass transfer characteristic. The first amplifier 120 utilizes the T-network 110 to set signal gain and/or create a DC biasing path.

An offset sensor 124 is configured to sense DC offset based on the output signal from the first amplifier 120 and to generate an offset reduction signal based on the sensed DC offset. The offset sensor 124 can include a low-pass filter 130 and a second amplifier 140. The low-pass filter 130 can be coupled to filter the output of the first amplifier 120 by extracting the low frequency component of the signal generated at the output of the first amplifier. This low-frequency component can be amplified by the second amplifier 140 to generate an error signal corresponding to the offset reduction signal. For example, the offset reduction signal can be proportional to the total offset voltage at the output of the first amplifier 120. The offset reduction signal can be applied to a biasing port of the T-network 110 to mitigate the offset voltage. In this manner, the circuit 100 exploits the low circuit area and high impedance characteristics of the T-Network 110 while concurrently reducing any DC offset that may be encountered as a result of input signal offsets and/or operations of the first amplifier 120 with the T-Network.

In one example, the system 100 can be provided as a circuit (e.g., integrated circuit, discrete circuit, combination of integrated circuit and discrete circuits) for generating first stage amplification and offset reduction therein. As a further example, the T-network 110 can include at least three resistors configured in a T-arrangement (e.g., at least three resistors sharing one common node). Each resistor in the T-network can be a single resistor or multiple resistors cooperating to form a single leg of the T. The resistors in the T-network can be coupled to provide a feedback connection between the input signal and the output signal for the first amplifier 120 and to receive the offset reduction signal to mitigate DC offset in the first amplifier. Thus, two nodes of the T-Network supply the feedback connections between the input and output of the first amplifier 120 and a third node of the T-Network receives the offset reduction signal from the offset sensor 124.

The second amplifier 140 can include a variable resistance feedback loop that can be adjusted during calibration of the circuit 100 to control the amount of DC offset that is reduced in the first amplifier 120. To provide adjustment at an integrated circuit scale, at least one transistor can be implemented in the variable resistance feedback loop of the second amplifier 140. The variable resistance of the second amplifier 140 can be adjusted by controlling an amount of bias applied to the transistor to select a given amount of resistance and to set the gain of the second amplifier to mitigate the DC offset in the first amplifier 120.

As a further example, the T-Network 110 can include at least one variable resistor that is adjusted to control the amount of signal gain in the first amplifier. Similar to the second amplifier 140, a transistor can operate as the variable resistor of the T-Network 110. The variable resistor of the T-Network 110 can similarly be adjusted by controlling an amount of bias applied to the transistor to select a given amount of resistance and to set the signal gain of first amplifier 120.

In some examples, the first amplifier 120 can be configured as a fully-differential amplifier that amplifies a first differential input signal (INPUT 1) and a second differential input signal (INPUT 2). The first amplifier 120 can be configured to generate a first differential output signal and a second differential output signal, which are amplified versions of the respective input signals. Such examples will be illustrated and described below with respect to FIG. 2. In a differential configuration, a second offset sensor can be configured to sense DC offset based on the second differential output signal. The second offset sensor can include a third amplifier (also referred to as auxiliary amplifier) configured to generate an offset reduction signal for the differential amplifier based on the sensed DC offset from the second differential output signal. In addition to the second offset sensor, the differential amplifier can employ a second T-network in a feedback loop from the second differential output signal to the second differential input signal where output from the third amplifier is employed to mitigate DC offset in the second differential output signal. Although not shown, a resonant sensor or a photodiode can provide an input signal to drive the first amplifier 120. The resonant sensor can include at least one of a piezo element, a capacitive element, a resistance element, and/or a magnetic element. Such sensors typically generate an output signal current based on a mechanical movement, for example.

Figure 2:
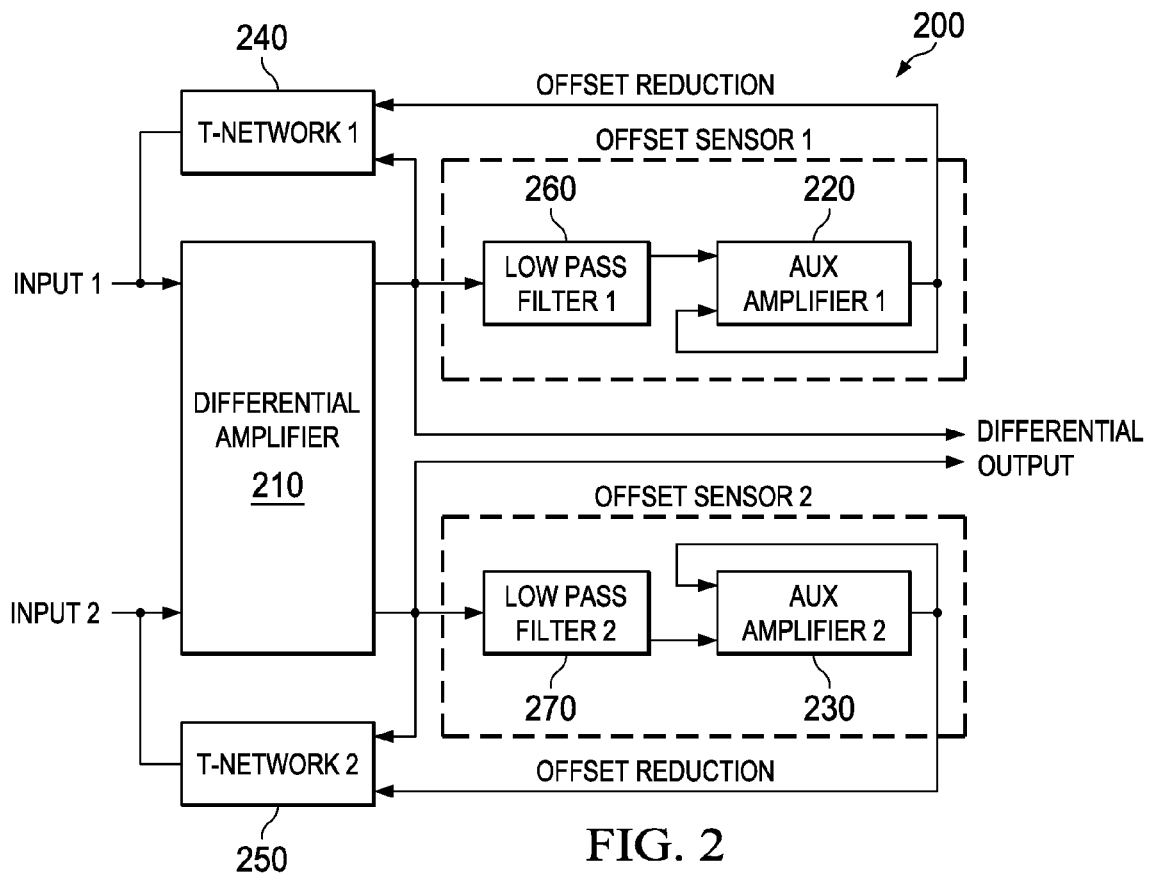
FIG. 2 illustrates a differential circuit to provide offset reduction in analog front-ends that employs multiple T-Networks in a feedback loop.

FIG. 2 illustrates a differential amplifier circuit 200 to provide offset reduction in analog front-ends that employs multiple T-Networks in a feedback loop. A differential amplifier 210 can be configured to amplify a first differential input signal (shown as input 1) and a second differential input signal (shown as input 2) to generate a first differential output signal and a second differential output signal (collectively shown as differential output). A first offset sensor (Offset Sensor 1) can be configured to sense DC offset based on the first differential output signal from the differential amplifier 210. The first offset sensor can include a first auxiliary amplifier 220 configured to generate a first offset reduction signal for the differential amplifier 210 based on the sensed DC offset of the first differential output signal. A second offset sensor (Offset Sensor 2) can be configured to sense DC offset based on the second differential output signal from the differential amplifier 210. The second offset sensor can include a second auxiliary amplifier 230 configured to generate a second offset reduction signal for the differential amplifier 210 based on the sensed DC offset of the second differential output signal.

A first T-network 240 can include at least three resistors coupled to provide a feedback connection between the first differential input signal and the first differential output signal for the differential amplifier 210. The T-network 240 also receives the first offset reduction signal to mitigate DC offset in first differential output of the differential amplifier 210. A second T-network 250 also includes at least three resistors coupled to provide a feedback connection between the second differential input signal and the second differential output signal for the differential amplifier 210. The second T-Network 250 also receives the second offset reduction signal to mitigate DC offset in the second differential output of the differential amplifier 210.

The first offset sensor can include a first low-pass filter at an input of the first auxiliary amplifier 220. A second low-pass filter 270 can be provided at an input to the second auxiliary amplifier 230, where both low-pass filters 260 and 270 isolate the DC offset from the differential amplifier 210. Similar to the circuit 100 described above with respect to FIG. 1, each auxiliary amplifier 220 and 230 and each T-Network 240 and 250 include at least one variable resistor that is adjusted, such as by controlling a bias voltage on a transistor.

Figure 3:
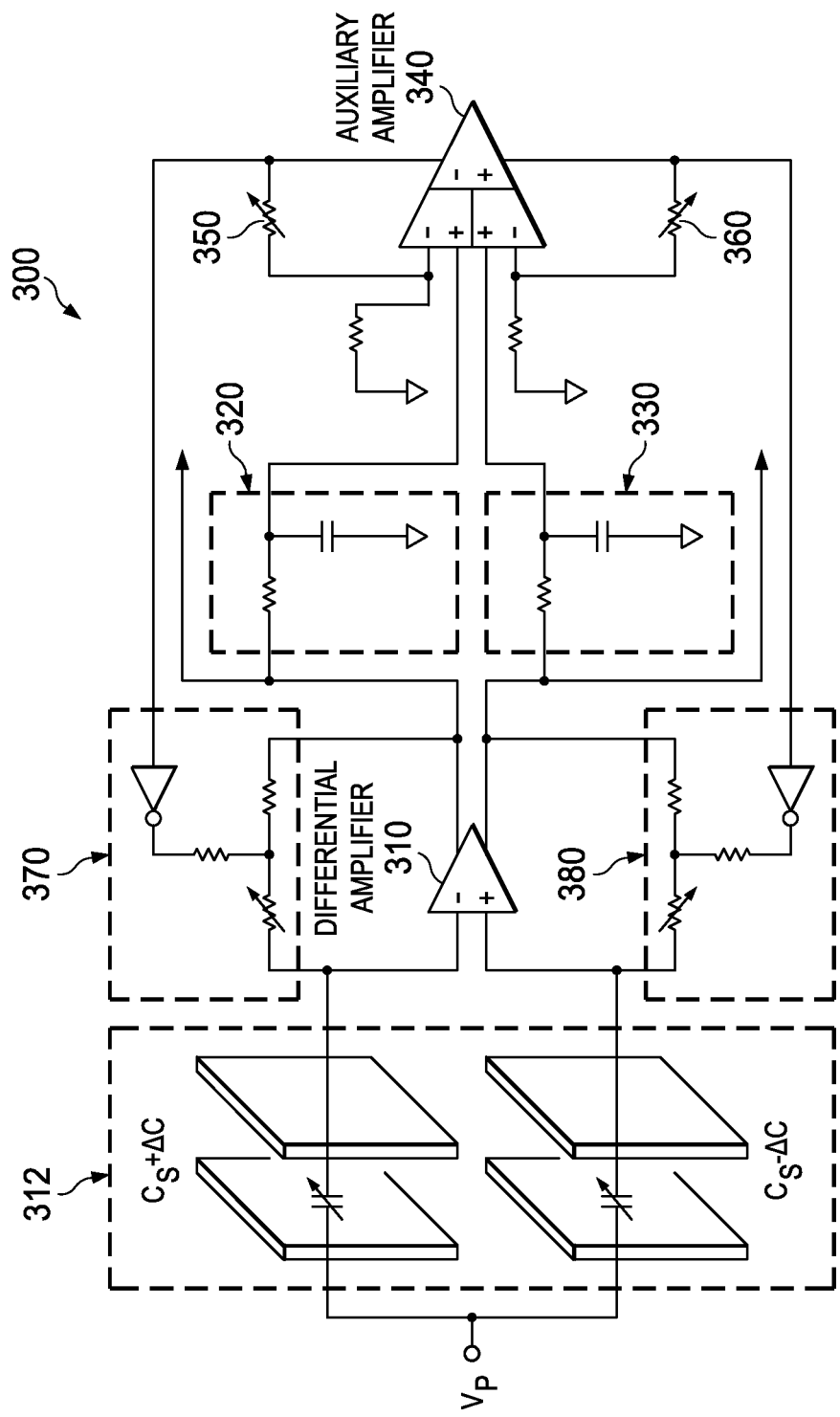
FIG. 3 illustrates a differential trans-resistance circuit to provide offset reduction in analog front-ends that employs multiple T-Networks in a feedback loop.

FIG. 3 illustrates a differential trans-resistance circuit 300 to provide offset reduction in analog front-ends that employs multiple T-Networks in a feedback loop. The trans-resistance circuit 300 can correspond to the example implementation for the amplifier circuit 200 of FIG. 2. A differential amplifier 310 receives an input signal, for example from a resonant sensor 312, such as a MEMS resonator or a MEMS gyroscope. The signal from the sensor, which is biased with a signal VP, can be provided as differential input voltages to the differential amplifier 310 based on a change in capacitance in one example of the resonant sensor 312. A mechanical movement of the sensor 312 causes a change in capacitance (shown as Cs+ΔC and Cs−ΔC) which causes a change in differential input voltage to the differential amplifier 310.

Differential output from the differential amplifier is fed through respective low-pass filters 320 and 330, which in turn supply filtered signals to auxiliary amplifiers, demonstrated as a single amplifier block at 340. The auxiliary amplifier 340 can be implemented using two single-ended amplifiers or a differential difference amplifier (DDA). Outputs from the dual amplifiers at 340 include separate variable feedback resistors 350 and 360 coupled between the respective outputs and inverting inputs. Each of the outputs of the amplifier 340 are coupled to provide offset reduction to T-Networks 370 and 380, respectively. As shown each of the T-Networks can include at least one variable resistor to control signal gain of the differential amplifier. The other two resistors in the T-Networks can be held in a fixed ratio with respect to each other and are selected according to the design needs of a given application. In other examples, two or more of the resistors in the T-Networks 370 or 380 can be made variable.

Figure 4:
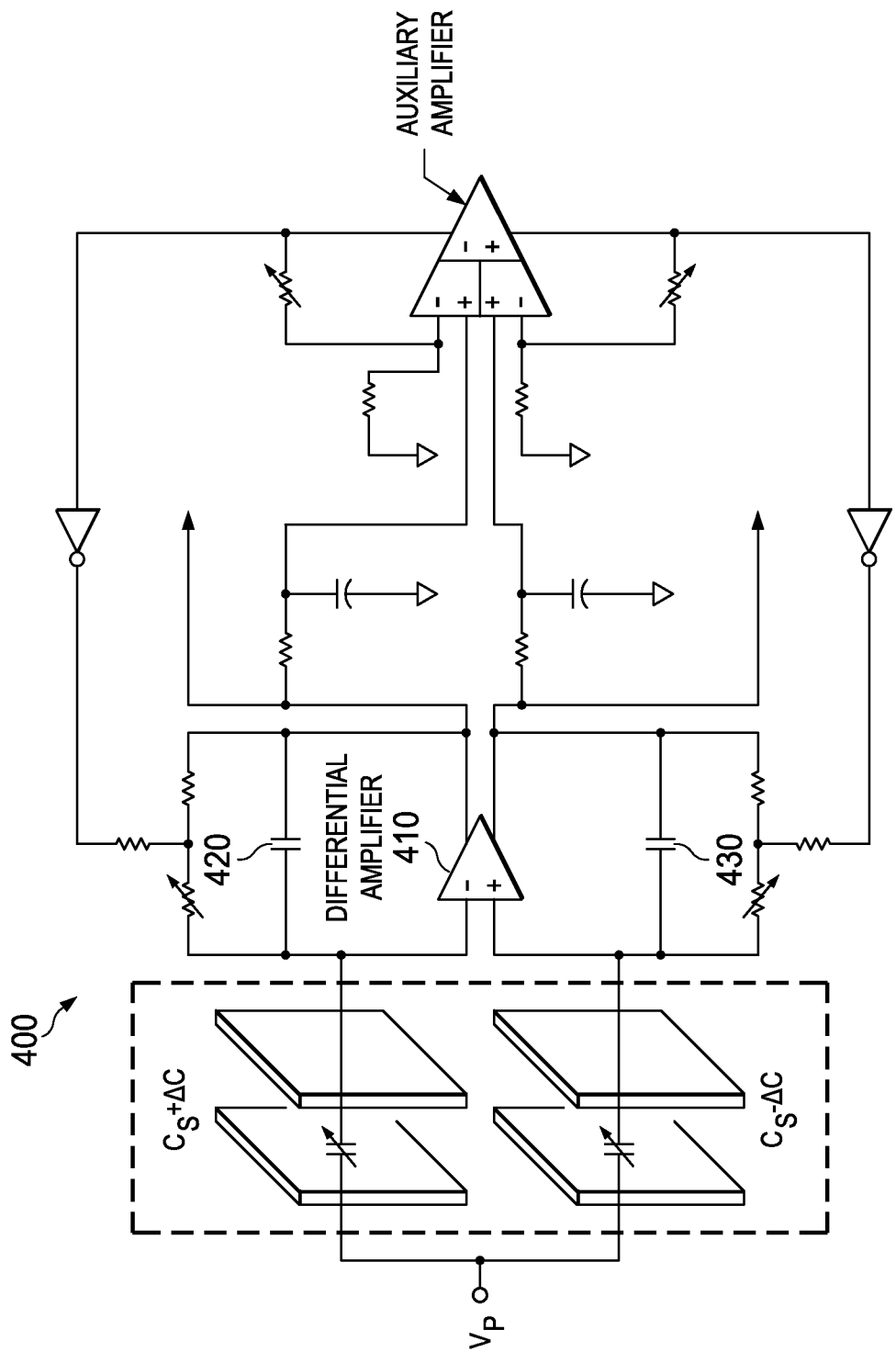
FIG. 4 illustrates a differential integrator circuit to provide offset reduction in analog front-ends that employs multiple T-Networks in a feedback loop.

FIG. 4 illustrates a differential integrator circuit 400 to provide offset reduction in analog front-ends that employs multiple T-Networks in a feedback loop. In FIG. 4, a capacitor is coupled across the T-Networks to provide an integrator configuration example. The circuit 400 includes substantially the same components as described above with respect to FIG. 3. Thus, for purposes of brevity, not all components of the circuit 400 are described herein as reference can be made back to the example of FIG. 3. In this example circuit 400, however, a differential amplifier 410 includes additional feedback capacitors 420 and 430 between each of the output and input nodes of the differential amplifier. Such capacitors can provide an integration function for the differential amplifier 410 and although they affect AC signal responses, such capacitors can be configured to substantially not affect DC operations of the circuit 400. In other words, the capacitors 420 and 430 do not adversely affect the ability of the circuit 400 to mitigate DC offsets as previously described with respect to FIG. 3.

Figure 5:
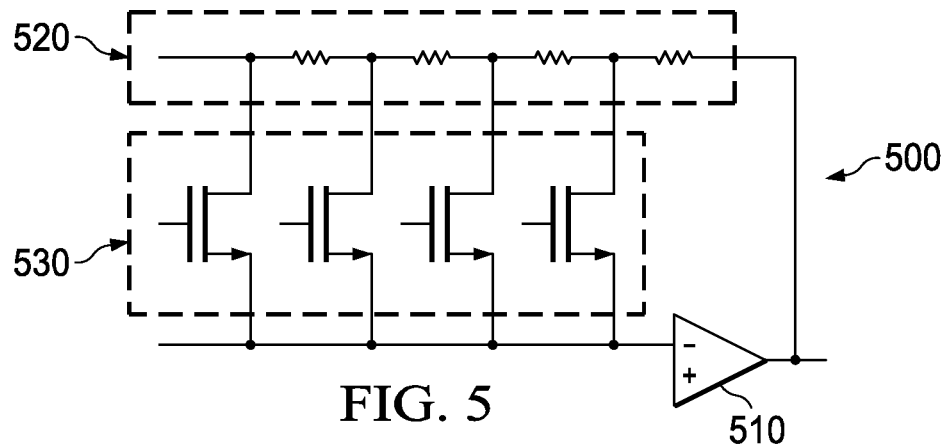
FIG. 5 illustrates a circuit for adjusting a variable resistance in a feedback network of an auxiliary amplifier that supplies an offset reduction signal to a T-Network

FIG. 5 illustrates a circuit 500 for adjusting a variable resistance in a feedback network of an auxiliary amplifier 510 that supplies an offset reduction signal to a T-Network. As shown, the auxiliary amplifier 510 can include a feedback network of resistors 520 (e.g., one or more resistors) and a corresponding adjustment network of transistors 530. By controlling the bias nodes on the transistors, precision feedback can be selected for the auxiliary amplifier during calibration which controls the amount of offset reduction feedback to the previous stage (e.g., single stage or differential front-end stage). As noted previously, even though a single amplifier block is shown at 510, a dual amplifier configuration can be supported for differential configurations where each of the amplifiers has separate feedback and transistor controls.

Figure 6:
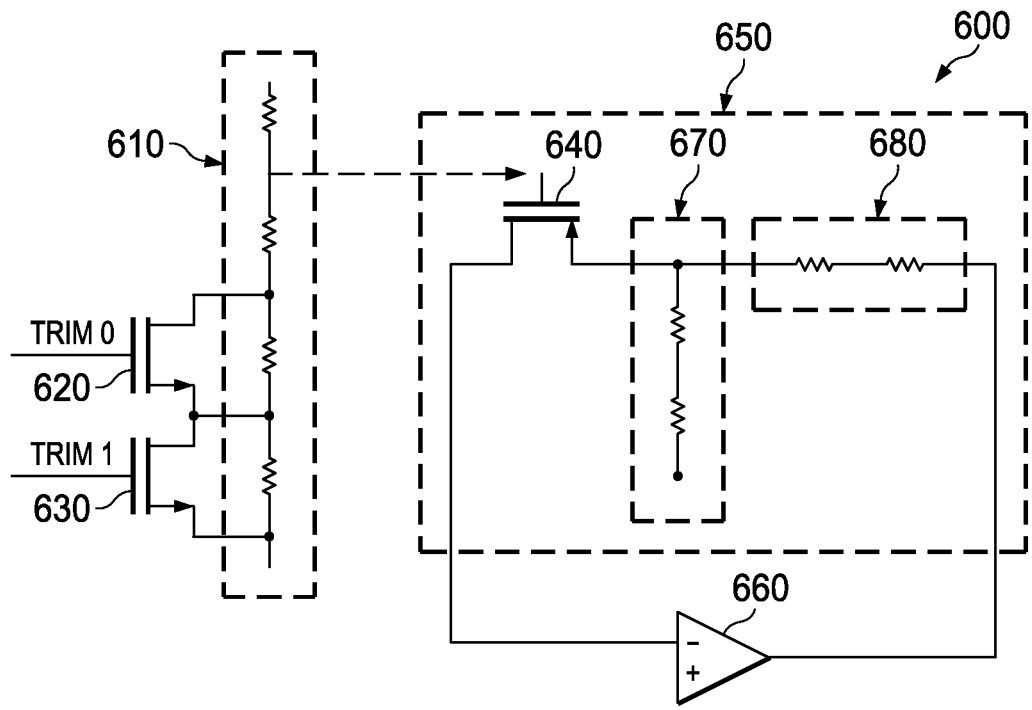
FIG. 6 illustrates a circuit for adjusting a variable resistance in a T-Network.

FIG. 6 illustrates a circuit 600 for adjusting a variable resistance in a T-Network. In this example, a bias network of resistors at 610 can be programmed for a desired bias voltage via trim inputs at 620 and 630 respectively. Output from the bias network 610 can be applied to the gate of transistor 640 which operates as one of the resistance nodes of a T-Network 650. As shown, the T-network 650 is coupled across amplifier 660. Resistors 670 and 680 of the T-Network 650 can be configured in a fixed ratio with respect to each other and with values set for a desired application (e.g., values set for a desired signal gain of the differential amplifier). An open node on resistor 670 can be coupled to an auxiliary amplifier (e.g., in the amplifier 510 of FIG. 5) output to mitigate DC offset in the amplifier 660. Each resistor shown can be implemented by a resistor, combination of resistors, a transistor, and/or a combination of resistors and transistors.

Figure 7:
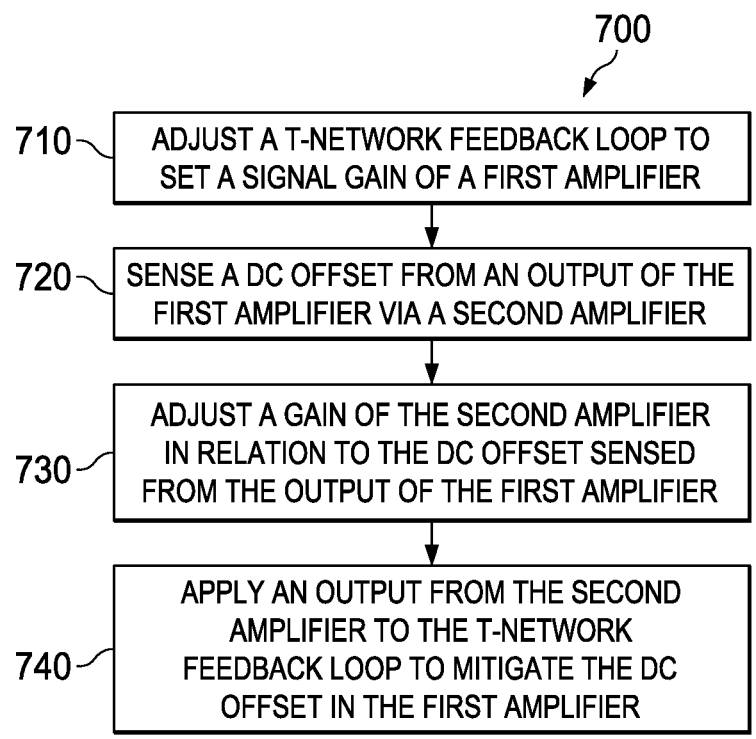
FIG. 7 illustrates a method to provide offset reduction in analog front-ends that employs a T-Network in a feedback loop.

In view of the foregoing structural and functional features described above, an example method will be better appreciated with reference to FIG. 7. While, for purposes of simplicity of explanation, the example method of FIG. 7 is shown and described as executing serially, it is to be understood and appreciated that the present examples are not limited by the illustrated order, as some actions could in other examples occur in different orders and/or concurrently from that shown and described herein. Moreover, it is not necessary that all described actions be performed to implement a method.

FIG. 7 illustrates a method 700 to provide offset reduction in analog front-ends that employ a T-Network in a feedback loop. At 710, the method 700 includes adjusting a T-network feedback loop to set the signal gain of a first amplifier (e.g., via T-Network 110 of FIG. 1, and via T-Network 240 and 250 of FIG. 2). At 720, the method 700 includes sensing an amount of DC offset of the first amplifier via a second amplifier (e.g., via second amplifier 140 of FIG. 1). At 730, the method 700 includes adjusting the gain of the second amplifier in relation to the amount of DC offset sensed at the output of the first amplifier (e.g., via feedback element of second amplifier 140 of FIG. 1). At 740, the method 700 includes applying an output from the second amplifier to the T-network feedback loop to mitigate the DC offset in the first amplifier (e.g., via offset reduction feedback shown in FIG. 1).

Other aspects of the method 700 can include filtering the DC offset at an input to the second amplifier (e.g., via low pass filter 130 of FIG. 1). The method 700 can include measuring the amount of DC offset of the first amplifier during a calibration procedure and adjusting the gain of the second amplifier in accordance with the measured amount to mitigate the DC offset in the first amplifier. The method 700 can also include amplifying a differential input signal and generating a first differential output signal and a second differential output signal via the first amplifier. This can include sensing the amount of DC offset of the first differential output signal via the second amplifier and sensing an amount of DC offset of the second differential output signal via a third amplifier. The method 700 can also include applying an output from the third amplifier to a second T-network coupled to the first amplifier to mitigate DC offset in the second differential output signal.

What have been described above are examples. It is, of course, not possible to describe every conceivable combination of components or methods, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit comprising:
   a first amplifier configured to amplify an input signal to generate an output signal;
   an offset sensor configured to sense DC offset based on the output signal, the offset sensor comprising a second amplifier configured to generate an offset reduction signal for the first amplifier based on the sensed DC offset; and
   a T-network that includes at least three resistors coupled to provide a feedback connection between the input signal and the output signal for the first amplifier and to receive the offset reduction signal to mitigate DC offset in the first amplifier,
   wherein the second amplifier includes a variable resistance feedback loop that is adjusted during calibration to control the amount of DC offset that is generated by the first amplifier.

2. The circuit of claim 1, wherein the variable resistance feedback loop of the second amplifier further comprises at least one transistor, wherein the variable resistance of the second amplifier is adjusted by controlling an amount of bias applied to the at least one transistor to select a given amount of resistance, which operates to set the gain of the second amplifier.

3. The circuit of claim 1, wherein the first amplifier includes at least one variable resistor in the T-Network that is adjusted to control the amount of signal gain provided by the first amplifier.

4. The circuit of claim 3, wherein the variable resistor of the T-Network further comprises at least one transistor, wherein the variable resistor of the T-Network is adjusted by controlling an amount of bias applied to the at least one the transistor to select a given amount of resistance of the of the variable resistor and to set the signal gain of first amplifier.

5. The circuit of claim 1, wherein the first amplifier further comprises a capacitor coupled across the T-Network to provide a charge integrator configuration for the first amplifier.

6. The circuit of claim 1, wherein the offset sensor further comprises a low pass filter that filters high signal frequencies and provides filtered DC offset voltages from the first amplifier to the second amplifier.

7. The circuit of claim 1, wherein the first amplifier is configured as a fully-differential amplifier that amplifies a first differential input signal and a second differential input signal and generates a first differential output signal and a second differential output signal.

8. The circuit of claim 7, further comprising a second offset sensor configured to sense DC offset based on the second differential output signal, the second offset sensor comprising a third amplifier configured to generate an offset reduction signal for the fully differential amplifier based on the DC offset sensed from the second differential output signal.

9. The circuit of claim 8, wherein the differential amplifier employs a second T-network in a feedback loop from the second differential output signal to the second differential input signal, wherein output from the third amplifier is employed to mitigate DC offset in the second differential output signal.

10. The circuit of claim 1, further comprising a resonant sensor to drive the first amplifier, wherein the resonant sensor includes at least one of a piezo element, a capacitive element, a resistance element, and a magnetic element.

11. A method comprising:
    adjusting a T-network feedback loop to set a signal gain of a first amplifier;
    sensing a DC offset from an output of the first amplifier via a second amplifier;
    adjusting a gain of the second amplifier in relation to the DC offset sensed from the output of the first amplifier;
    applying an output from the second amplifier to the T-network feedback loop to mitigate the DC offset in the first amplifier, and
    measuring the amount of DC offset of the first amplifier during a calibration procedure and adjusting the gain of the second amplifier based on the measured amount to mitigate the DC offset in the first amplifier.

12. The method of claim 11, further comprising filtering the DC offset in the output of the first amplifier and providing a filtered signal to an input to the second amplifier.

13. The method of claim 11, further comprising amplifying a differential input signal and generating a first differential output signal and a second differential output signal via the first amplifier.

14. The method of claim 13, further comprising sensing the amount of DC offset of the first differential output signal via the second amplifier and sensing an amount of DC offset of the second differential output signal via a third amplifier.

15. The method of claim 14, further comprising applying an output from the third amplifier to a second T-network coupled to the first amplifier to mitigate DC offset in the second differential output signal.

16. An integrated circuit comprising:
    a differential amplifier configured to amplify a first input signal and a second input signal to generate a first output signal and a second output signal;
    a first offset sensor configured to sense DC offset based on the first output signal, the first offset sensor comprising a first auxiliary amplifier configured to generate a first offset reduction signal for the differential amplifier based on the sensed DC offset of the first output signal;
    a second offset sensor configured to sense DC offset based on the second output signal, the second offset sensor comprising a second auxiliary amplifier configured to generate a second offset reduction signal for the differential amplifier based on the sensed DC offset of the second output signal;
    a first T-network that includes at least three resistors coupled to provide a feedback connection between the first input signal and the first output signal for the differential amplifier and to receive the first offset reduction signal to mitigate DC offset in first output signal of the differential amplifier; and
    a second T-network that includes at least three resistors coupled to provide a feedback connection between the second input signal and the second output signal for the differential amplifier and to receive the second offset reduction signal to mitigate DC offset in the second output signal of the differential amplifier.

17. The integrated circuit of claim 16, further comprising:
    a first low pass filter at an input of the first auxiliary amplifier; and
    a second low pass filter at an input to the second auxiliary amplifier.

18. The integrated circuit of claim 17, wherein each auxiliary amplifier and each T-Network have at least one variable resistor.

* * * * *